(12) United States Patent
Doh et al.

(10) Patent No.: US 7,266,312 B2
(45) Date of Patent: Sep. 4, 2007

(54) BURST MODE OPTICAL RECEIVER

(75) Inventors: Hee-Chan Doh, Suwon-shi (KR);
 Gil-Yong Park, Suwon-shi (KR);
 Shin-Hee Won, Seoul (KR);
 Byung-Chang Kang, Yongin-shi (KR);
 Tae-Sung Park, Suwon-shi (KR);
 Hyeon-Cheol Ki, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 687 days.

(21) Appl. No.: 10/391,670

(22) Filed: Mar. 19, 2003

(65) Prior Publication Data

US 2003/0194243 A1 Oct. 16, 2003

(30) Foreign Application Priority Data

Apr. 16, 2002 (KR) ............ 10-2002-0020607

(51) Int. Cl.
 *H04B 10/06* (2006.01)
(52) U.S. Cl. .................... 398/210; 398/202
(58) Field of Classification Search ........... 398/202, 398/210; 250/214 A, 214 AG
 See application file for complete search history.

(56) References Cited

U.S. PATENT DOCUMENTS

| | | | | |
|---|---|---|---|---|
| 5,822,104 | A * | 10/1998 | Saito ................... | 398/202 |
| 5,953,690 | A * | 9/1999 | Lemon et al. ........ | 702/191 |
| 6,072,366 | A * | 6/2000 | Maeda et al. ........ | 330/254 |
| 2002/0063937 | A1* | 5/2002 | Kikuchi ............... | 359/189 |

FOREIGN PATENT DOCUMENTS

| | | |
|---|---|---|
| DE | 2905903 | 8/1980 |
| EP | 0597632 A1 | 5/1994 |
| EP | 0828359 A2 | 3/1998 |
| GB | 1568513 | 10/1976 |

OTHER PUBLICATIONS

S. Yamashita et al., "Novel cell-AGC Technique for Burst-Mode CMOS Preamplifier with Wide Dynamic Range and High Sensitivity for ATM-PON System", Solid-State Circuit Conference, Sep. 18-20, 2001, IEEE.*
Takeshi Nagahori et al., "Short Guard Bit/Burst Transmission in PON System Using Fast Response Automatic Threshold Control Receiver", Sep. 7, 1993, pp. 305-1-305-5.
Charles A. Eldering, "Theoretical Determination Of Sensitivity Penalty For Burst Mode Fiber Optic Receivers", Dec. 1, 1993, pp. 2145-2149.

* cited by examiner

*Primary Examiner*—Shi K. Li
(74) *Attorney, Agent, or Firm*—Cha & Reiter, L.L.C.

(57) ABSTRACT

A burst mode optical receiver is disclosed and includes a converter for converting a burst mode signal into a voltage signal, a bottom level detector for detecting a bottom level of an output signal from the converter, an automatic gain controller for automatically controlling the gain of the converter on the basis of the bottom level detected by the bottom level detector in order to maintain an amplitude of the output signal from the converter and generating a reset signal when the bottom level is lower than a predetermined reference value, and a power level detector for detecting a power level of the output signal from the converter and generating the reset signal and an LOS signal indicative of the presence of no input signal when the detected power level is lower than a predetermined reference value.

12 Claims, 7 Drawing Sheets

BURST MODE OPTICAL RECEIVER

CLAIM OF PRIORITY

This application claims priority to an application entitled "BURST MODE OPTICAL RECEIVER", filed in the Korean Industrial Property Office on Apr. 16, 2002 and assigned Serial No. 2002-20607, the contents of which are hereby incorporated by reference.

BACKGROUND OF THE INVENTION

1. Field of the Invention

The present invention relates to burst mode optical receivers, and more particularly to a burst mode optical receiver for determining whether an input signal is present and independently generating a reset signal for the initialization of an inter-packet period in accordance with the determined result.

2. Description of the Related Art

In order to transfer a large amount of information more rapidly to subscribers, a next-generation communication system known as an FTTH (fiber to the home) system, which includes an optical line installed up to each home, has been introduced. However, the FTTH system has drawbacks in that a high cost is involved in replacing the existing subscriber networks of copper wires. In this regard, a passive optical network (PON) is taken into consideration for the implementation of FTTH system at a much lower cost.

Figure 1:
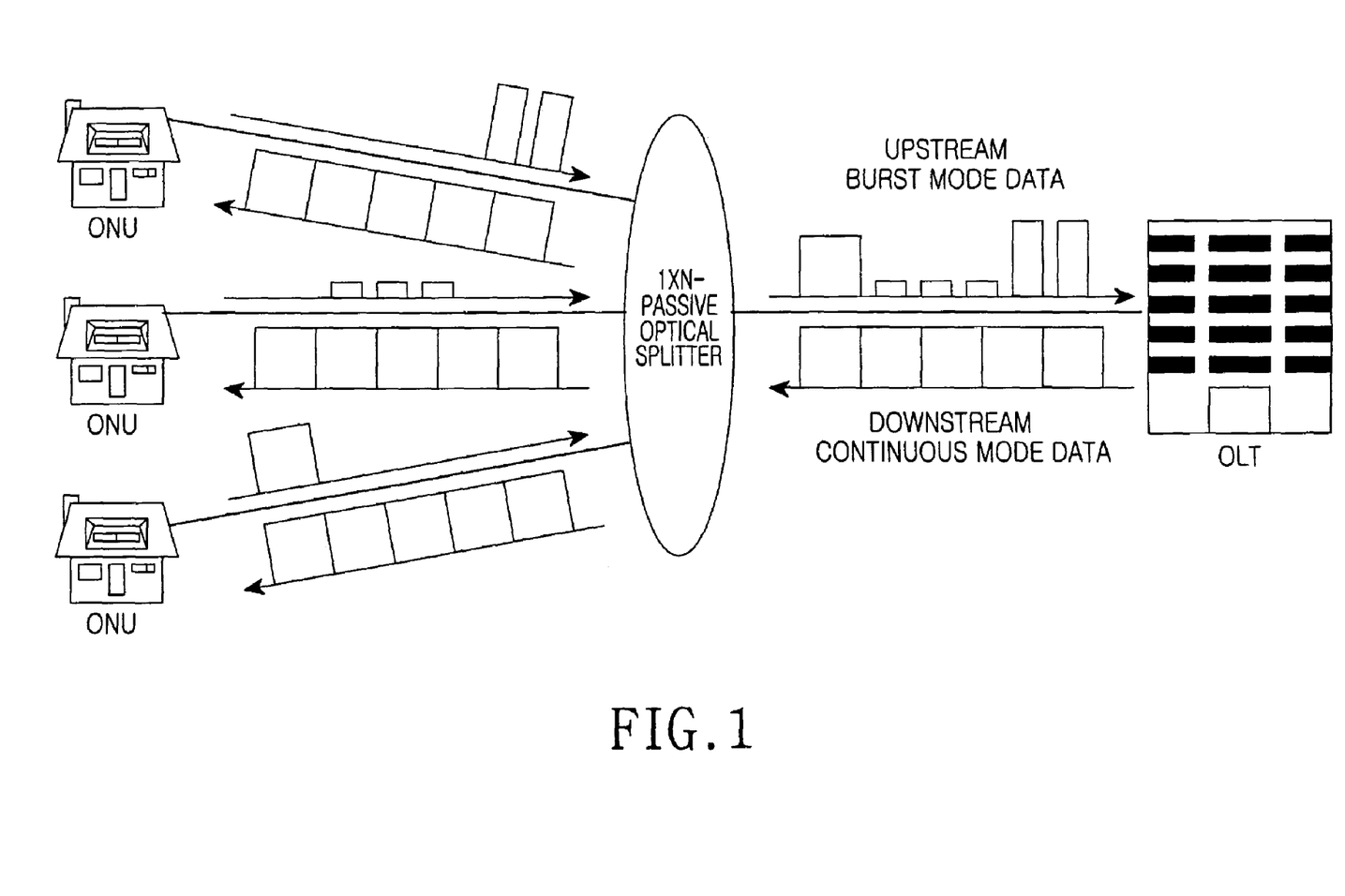
FIG. 1 is a view showing the construction of a passive optical network.

FIG. 1 illustrates the construction of a passive optical network. As shown in this drawing, the passive optical network comprises an OLT (Optical Line Termination) in a central office, a 1×N-passive optical splitter, and a plurality of ONUs (Optical Network Units) of subscribers.

In an optical multi-connection network, such as the passive optical network, each node transfers a packet or data to another node using a predetermined time slot. This optical multi-connection network is different from an existing point-to-point link in that the received data or packets are different in amplitude and phase from one another due to the optical losses occurring on different transfer paths. Such data is typically called burst mode data. In other words, when a plurality of subscribers transmits data via a single optical line in a time division multiplex manner, the receiver, OLT, perceives as if each subscriber sends data at a random time. Further, the incoming data packets are not constant in amplitude due to differences in the paths to the respective subscribers.

As a result, a burst mode optical receiver has recently been used which is configured to receive burst mode data that is different in amplitude and phase on a packet basis but restores the received burst mode data such that their packets are the same in amplitude and phase. In this regards, the burst mode optical receiver removes a DC blocking capacitor used in an AC coupling scheme of a conventional receiver to prevent the losses of burst mode data resulting from charging/discharging times of the capacitor. The burst mode optical receiver also functions to extract a detection threshold as a reference signal for data detection from each received burst mode packet and also functions to restore data by amplifying it symmetrically with respect to the extracted detection threshold.

Figure 2:
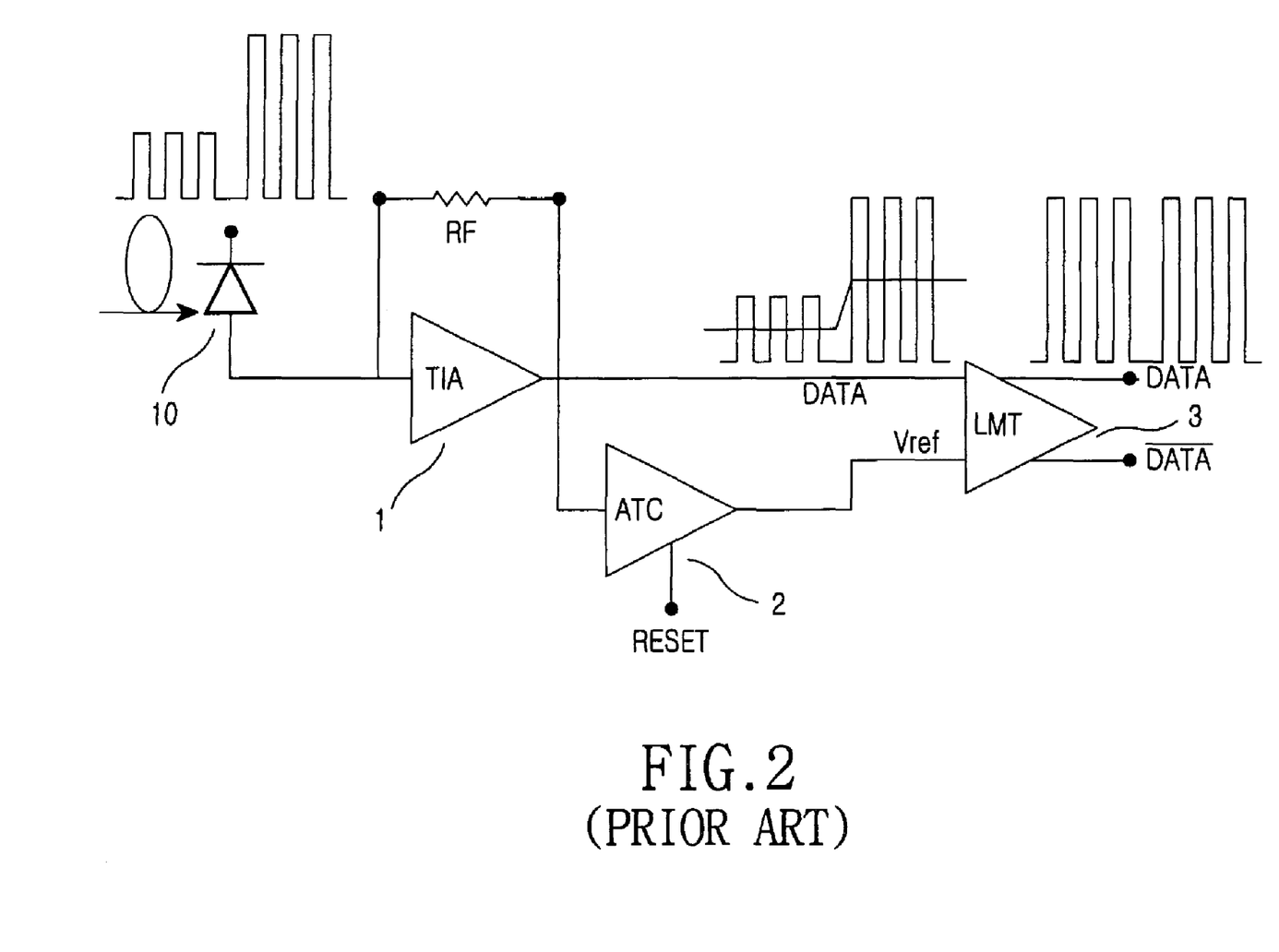
FIG. 2 is a view showing the construction of a conventional burst mode optical receiver.

FIG. 2 schematically shows the construction of a conventional burst mode optical receiver. As shown in this drawing, the conventional burst mode optical receiver comprises an optical detector 10, a preamplifier or trans-impedance amplifier (TIA) 1, an automatic threshold controller (ATC) 2, and a limiting amplifier 3.

In operation, the optical detector 10 converts an input optical signal into a current signal. The TIA 1 functions to convert the current signal converted by the optical detector 10 into a voltage signal. A trans-impedance, which is an input current-to-output voltage ratio, is determined by a feedback resistor Rf connected between an input terminal of the TIA 1 and an output terminal thereof. Note that the TIA 1 is used in a DC coupling manner. The input signal is amplified by the TIA 1 and then branches off into two parts. One part is inputted to the ATC 2, which then extracts a detection threshold of a received packet therefrom. The other part is DC-coupled and inputted to the limiting amplifier 3. The detection threshold, which changes according to the amplitude of the corresponding packet, is inputted to the Vref of the limiting amplifier 3. The limiting amplifier 3 functions to amplify signals of different amplitudes inputted thereto to restore them to ones of a constant amplitude using the Vref.

However, the conventional burst mode optical receiver has a disadvantage in that a reset signal for initialization in an inter-packet period is inputted via an external additional circuit, which in turn making it difficult to control the reset timing accurately. Moreover, the use of the external additional circuit makes the receiver circuitry complicated and increases the size of the receiver components.

SUMMARY OF THE INVENTION

The present invention has overcomes the above problems and provides additional advantages, by providing a burst mode optical receiver that is capable of determining whether an input signal is present and independently generating an initial reset signal in accordance with the determined result.

One aspect of the present invention is to provide a giga-class burst mode optical receiver capable of receiving burst mode data that is different in amplitude and phase on a packet basis and restoring the received burst mode data accurately and rapidly.

Another aspect is that the present invention may be realized in a simple, reliable, and inexpensive implementation.

One embodiment of the present invention provides a burst mode optical receiver comprising: a converter for converting a burst mode signal into a voltage signal; a bottom level detector for detecting a bottom level of an output signal from the converter; an automatic gain controller for automatically controlling the gain of the converter on the basis of the bottom level detected by the bottom level detector to constantly maintain an amplitude of the output signal from the converter and for generating a reset signal when the bottom level is lower than a predetermined reference value; and, a power level detector for detecting a power level of the output signal from the converter and generating the reset signal and an LOS signal indicative of the presence of no input signal when the detected power level is lower than a predetermined reference value.

Preferably, the converter may include an optical detector for converting the burst mode signal into a current signal and a trans-impedance amplifier for converting the current signal converted by the optical detector into the voltage signal.

Preferably, the automatic gain controller may generate a control signal at the moment when the output signal from the converter begins to be distorted, so as to prevent the output signal from the converter from becoming too low due to a low operating reference level of the controller, or to prevent the controller from being operated after the output signal from the converter is distorted due to a high operating reference level of the controller.

Preferably, the power level detector may include a capacitor for coupling the output signal from the converter to detect the power level thereof irrespective of a DC level of an input signal.

More preferably, the burst mode optical receiver may further comprise a pulse generator for generating a pulse signal as the reset signal or LOS signal.

BRIEF DESCRIPTION OF THE DRAWINGS

The above and features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the annexed drawings. In the drawings, the same or similar elements are denoted by the same reference numerals even though they are depicted in different drawings. For the purposes of clarity and simplicity, a detailed description of known functions and configurations incorporated herein will be omitted as it may make the subject matter of the present invention unclear.

Figure 3:
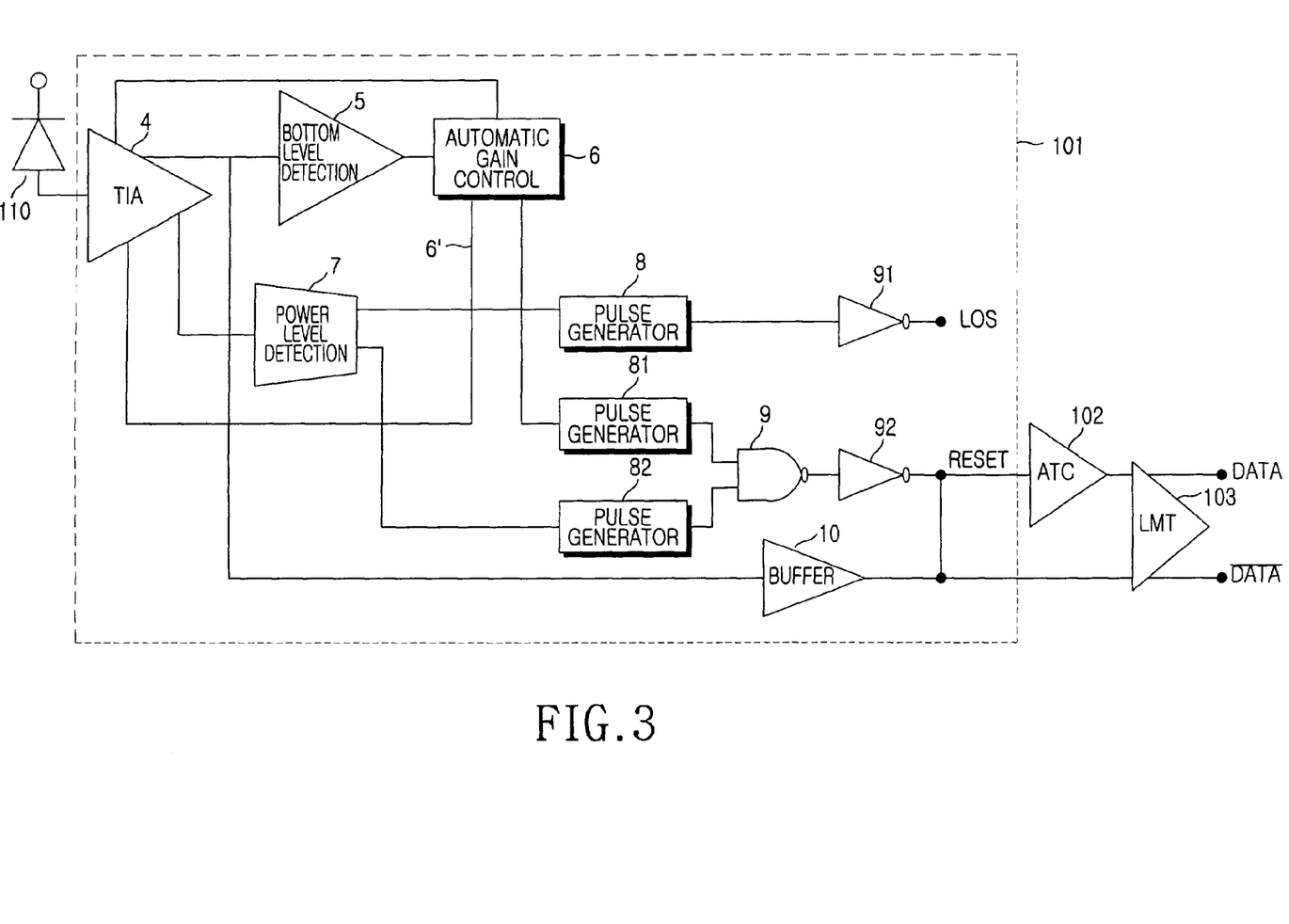
FIG. 3 is a view showing the construction of a burst mode optical receiver in accordance with the present invention.

FIG. 3 shows the construction of a burst mode optical receiver in accordance with the embodiment of the present invention. As shown, the burst mode optical receiver includes an optical detector 110, a preamplifier 101, an automatic threshold controller (ATC) 102, and a limiting amplifier 103.

The preamplifier 101 includes a trans-impedance amplifier (TIA) 4 for determining the gain and bandwidth of the preamplifier 101, a bottom level detector 5 for detecting a bottom level of an output signal from the TIA 4, an automatic gain controller (AGC) 6 for generating an automatic gain control signal on the basis of the bottom level detected by the bottom level detector 5 in order to control the gain of the TIA 4 automatically, and a power level detector 7 for detecting a power level of the output signal from the TIA 4. The preamplifier 101 further includes a plurality of pulse generators 8, 81 and 82, a NAND gate 9, and an output buffer 10 for the TIA 4.

In operation, the TIA 4 converts an output current signal from the optical detector 110 into a voltage signal and determines the gain and bandwidth of the preamplifier 101.

The bottom level detector 5 detects the bottom level of an output signal from the TIA 4. That is, the bottom level detector 5 always detects the bottom level of a signal inputted thereto, or the output signal from the TIA 4 irrespective of whether the output signal from the TIA 4 is high or low. As explained later, the use of the detected bottom level minimizes the signal distortion, the power fluctuation, etc., thereby making it possible to accurately and stably determine whether an input signal is present, and further enables the accurate generation of an AGC signal and the accurate determination of an inter-packet period, so that an output voltage can always be maintained at a proper level. In the prior art detector, a peak level has a no particular problem when an input signal is high, but provides inaccurate information regarding an actual voltage level when the input signal is low, resulting in difficulty in determining whether the input signal is present.

The AGC 6 analyzes the voltage level of an input signal on the basis of the bottom signal level detected by the bottom level detector 5, then adjusts the gain of the TIA 4 if the analyzed voltage level is higher than a predetermined reference value and amplifies the input signal if the analyzed voltage level is less than the predetermined reference value (see the reference numeral 6' in FIG. 3). If the AGC 6 determines based on the bottom signal level that no input signal is present, then it generates a reset signal indicative of packet termination.

The output current signal from the optical detector 110 generally has current variations within the range of −31 dBm to −16 dBm. Provided that a certain current variation of the output signal from the optical detector 110 is beyond this range, the output signal from the TIA 4 will be subject to a considerable distortion. In this connection, the AGC 6 must be operated to compensate for the distortion in the output signal from the TIA 4.

The AGC 6 starts to perform its control operation at the moment that the output signal from the TIA 4 begins to be distorted. Note that the bottom level circuit 5 is operative to detect the voltage level of an input signal and performs, as above mentioned, well within the range of −31 dBm to −16 dBm. However, if the detected voltage level is out of the 31 dBm to −16 dBm range, a distortion of the circuit occurs. Accordingly the AGC 6 does not operate when the detected voltage is in the range of −31 dBm to −16 dBm. At the same time, if the bottom level circuit 5 gets out of the detection ranges, the AGC 6 operates to feed the information back to TIA for an adjustment, thus preventing the distortion caused by the undesirable voltage range. This has the effect of preventing the output signal from the TIA 4 from becoming too low due to a low operating reference level of the AGC 6, or preventing the AGC 6 from being operated after the output signal from the TIA 4 is distorted due to a high operating reference level of the AGC 6.

Meanwhile, the power level detector 7 detects the power level of the output signal from the TIA 4 to determine whether an input signal is present and whether an interpacket period is present. For example, when the power level of the output signal from the TIA 4 is lower than a predetermined reference value (for example, −30 dBm), the power level detector 7 generates an LOS signal indicative of the presence of no signal.

The power level detector 7 provides its two output signals, one of which is passed through the pulse generator 8 and an inverter 91 for generation of the LOS signal and the other is applied to an input terminal of a reset signal generation circuit.

The output signal from the TIA 4 is coupled by a capacitor and then applied to the power level detector 7 so that the power level thereof can be detected regardless of a DC level of an input signal.

The pulse generator 8 generates a pulse signal in response to the first output signal from the power level detector 7 to indicate packet start, packet termination, and an interpacket period. These information is obtained by comparing to a known standardized packet format. For example, for a packet size according to the IEEE 802.3ah standardization, a pulse signal is periodically generated within planned time (i.e., 3 times in FIG. 3). The pulse signal generated by the pulse generator 8 is inverted by the inverter 91 and then outputted as LOS signal. The pulse generator 81 generates a pulse signal in response to the output signal from the AGC 6, and the pulse generator 82 generates a pulse signal in response to the second output signal from the power level detector 7. The pulse signals generated by the pulse generators 81 and 82 are NANDed by the NAND gate 9, inverted by an inverter 92 and then outputted as a reset signal.

The output buffer 10 is adapted to regulate the DC level of the final output signal of the preamplifier 101 in consideration of final output signal to the ATC 102 and the limiting amplifier 103, thereby regulating the DC level of the final output signal.

Figure 4A:
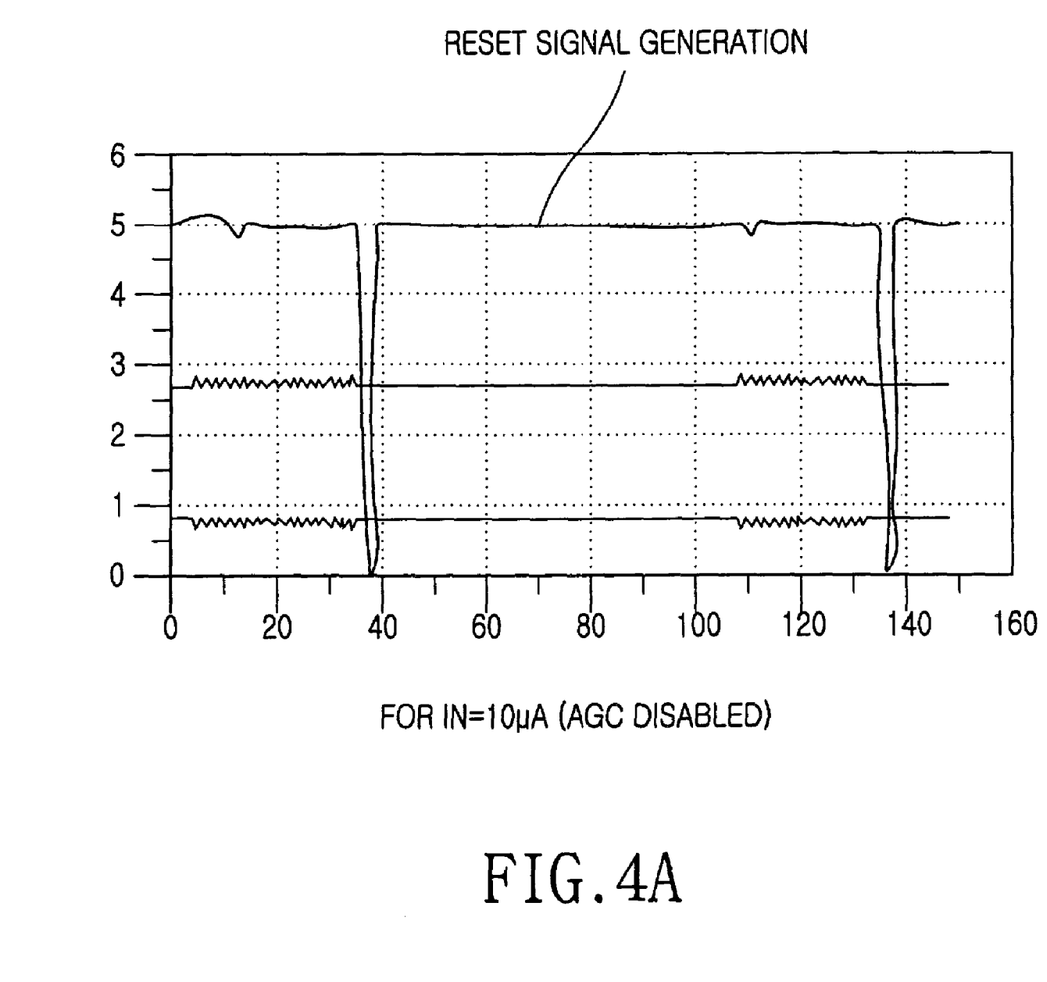
FIGS. 4a and 4b are output waveform diagrams illustrating the operation characteristics of a preamplifier based on a small input current in accordance with the present invention; and, FIGS. 5a and 5b are output waveform diagrams illustrating the operation characteristics of the preamplifier based on a large input current in accordance with the present invention.
Figure 4B:
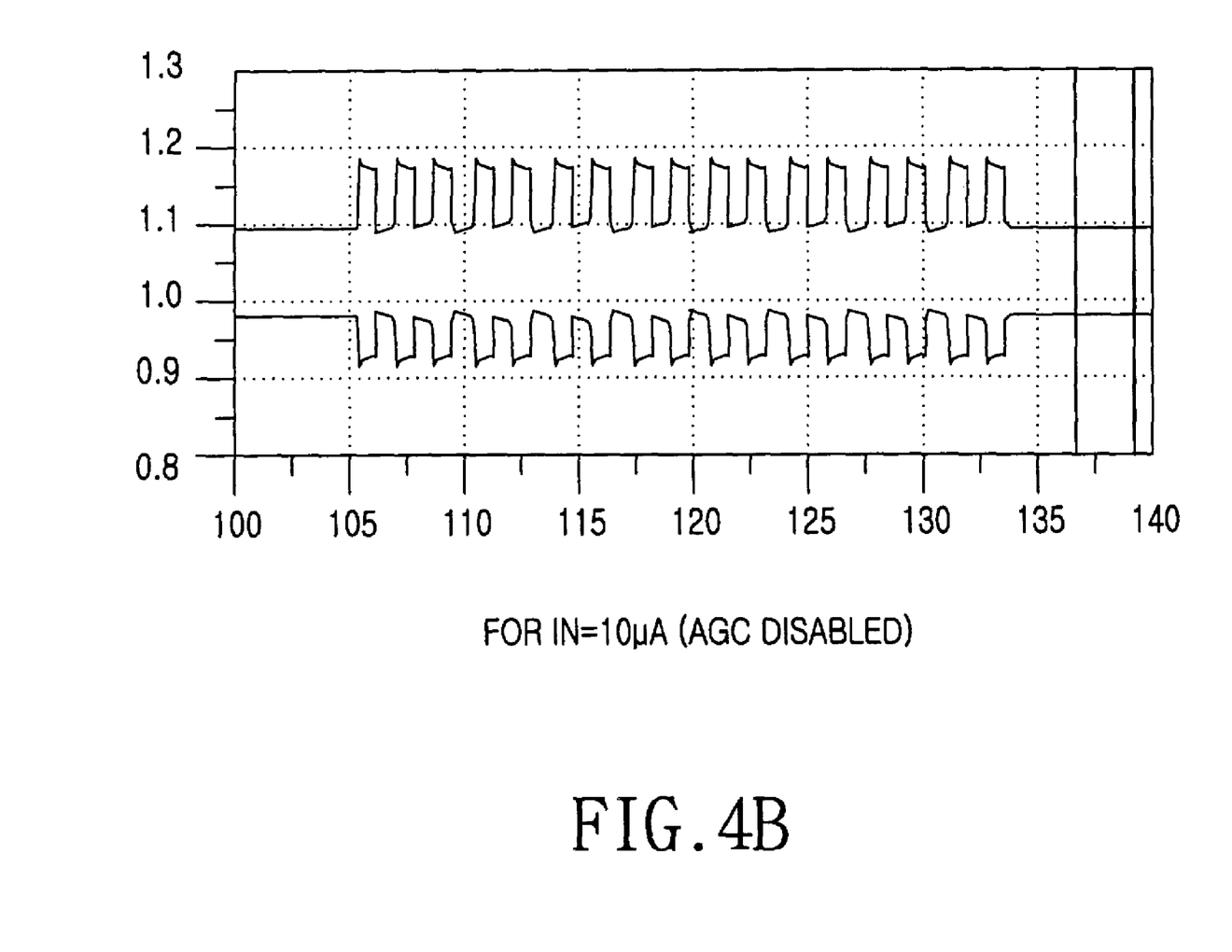
Figure 5A:
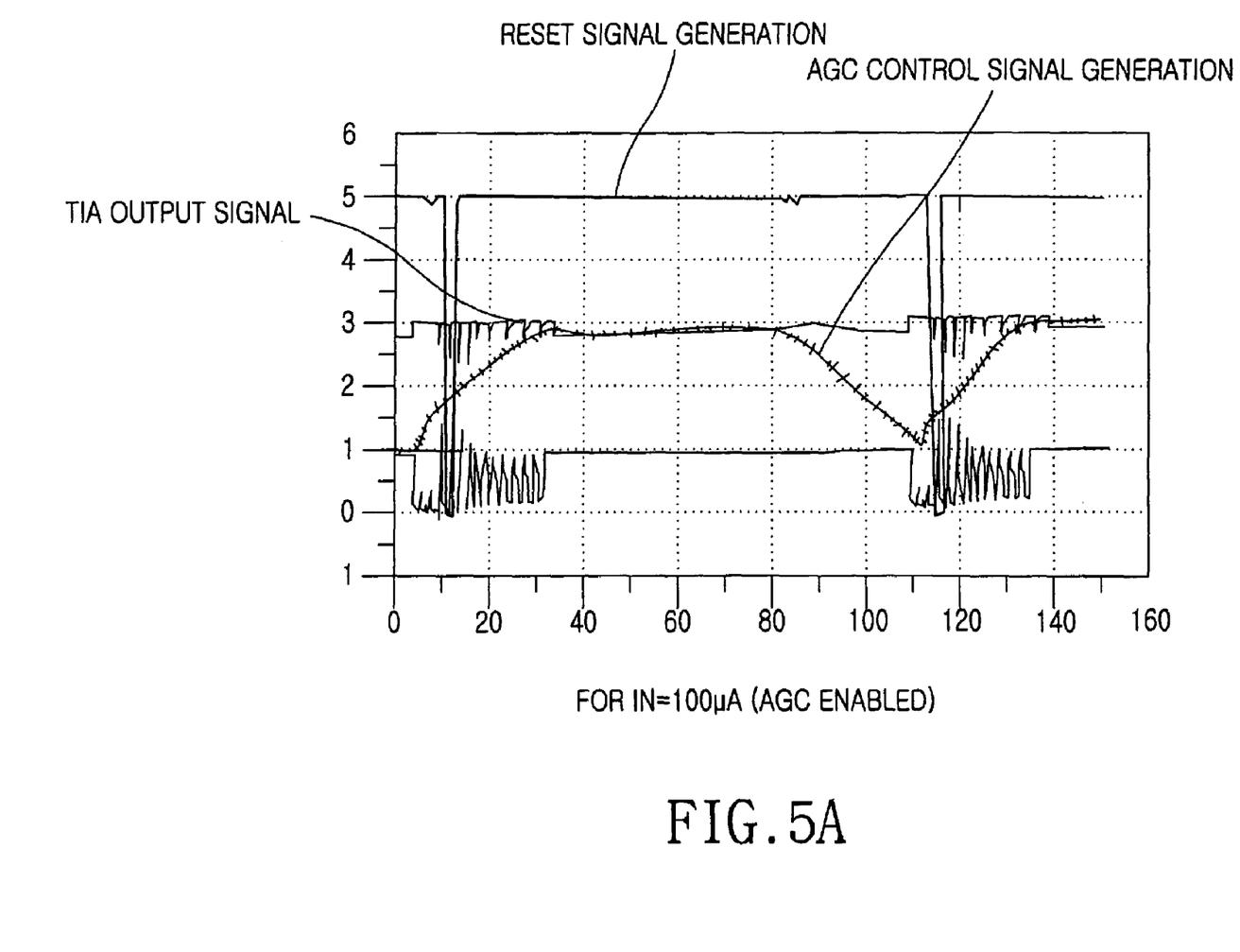
Figure 5B:
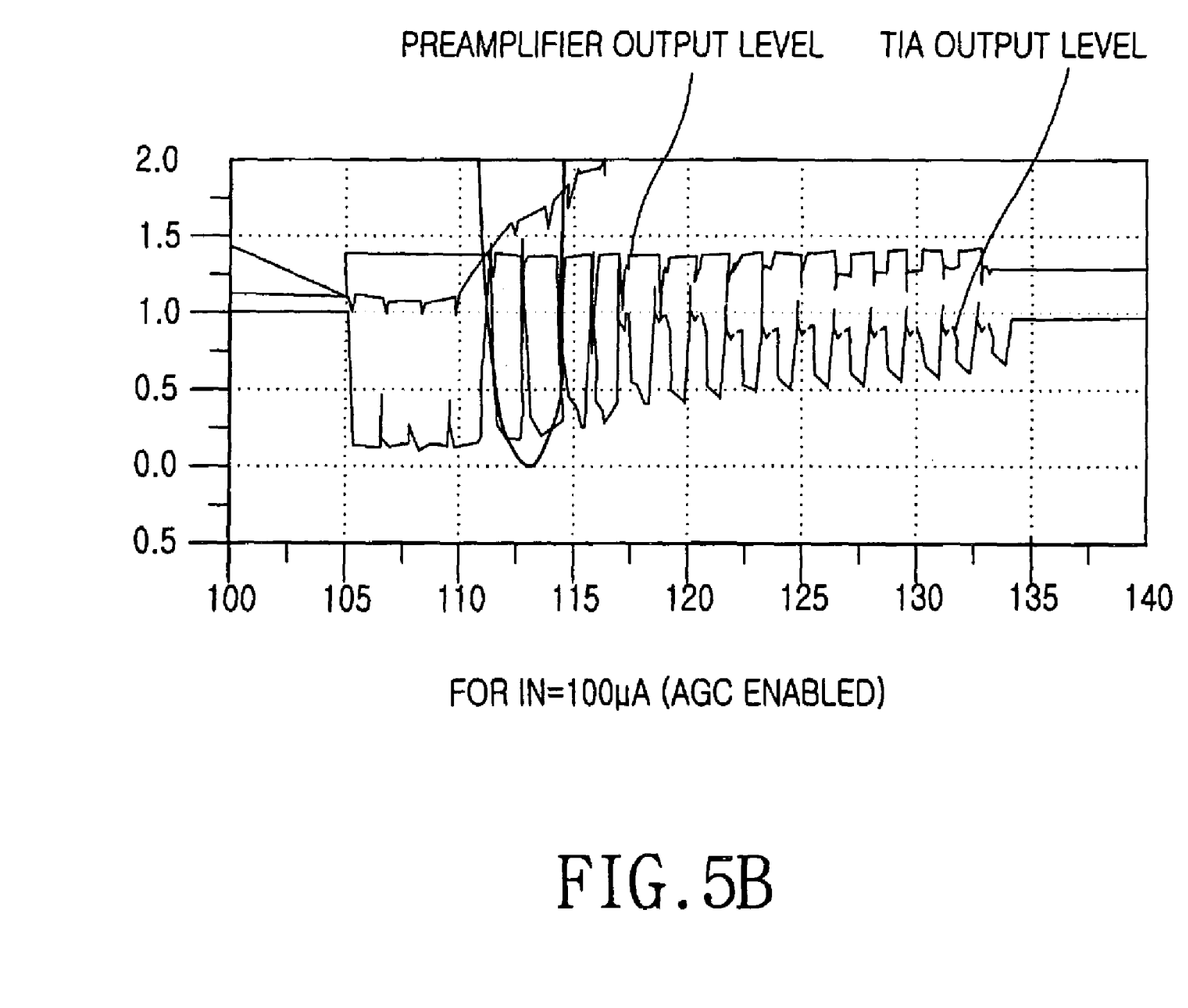

FIGS. 4a and 5a are output waveform diagrams illustrating operation characteristics of the preamplifier 101 when input current is 10 μA and 100 μA, respectively, wherein the axis of ordinate represents a voltage level and the axis of abscissa represents time. It can be seen from FIG. 4a that the AGC 6 generates no control signal when the input current is small (for example, 10 μA). However, when the input current is of a certain large level (for example, 100 μA), the AGC 6 generates a control signal (see FIG. 5a). FIGS. 4b and 5b are enlarged views of FIGS. 4a and 5a, respectively, wherein a value of the preamplifier output level—1.6V is shown so that the output level can be depicted in one graph.

As apparent from the above description, the present invention provides a burst mode optical receiver capable of independently generating a reset signal for initialization in an inter-packet period. The present burst mode optical receiver can overcome difficulty in shortening timing for generation of the reset signal and does not need an additional circuit, resulting in a reduction in the size of the receiver parts.

In addition, the burst mode optical receiver according to the present invention can detect a bottom level of an input signal, so that it can accurately recognize information regarding an actual voltage level and, in turn, accurately determine whether the input signal is present even though the input voltage signal is low.

Furthermore, the burst mode optical receiver according to the present invention is capable of receiving burst mode data that is different in the amplitude and phase on a packet basis and restoring the received burst mode data accurately and rapidly.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A burst mode optical receiver comprising:
a converter for converting an input signal into a voltage signal;
a detector for detecting a bottom level of an output signal from said converter;
an automatic gain controller for selectively controlling a gain of said converter based on said bottom level detected by said detector so that the amplitude of said output signal from said converter can be maintained to a desired shape;
a power level detector for detecting a power level of said output signal from said converter;
first and second pulse generators configured to output a reset signal, the first pulse generator inputting an output from the power level detector and the second pulse generator inputting an output from the automatic gain controller.

2. The burst mode optical receiver as set forth in claim 1, wherein said converter includes:
an optical detector for converting said input signal into a current signal; and,
a trans-impedance amplifier for converting said current signal converted by said optical detector into said voltage signal.

3. The burst mode optical receiver as set forth in claim 1, wherein said automatic gain controller is adapted to generate a control signal at the moment that said output signal from said converter begins to be distorted, so as to prevent said output signal from said converter from becoming below a predetermined operating level.

4. The burst mode optical receiver as set forth in claim 1, wherein said automatic gain controller is adapted to generate a control signal at the moment that said output signal from said converter begins to be distorted in order to prevent said controller from being operated after said output signal from said converter is distorted.

5. The burst mode optical receiver as set forth in claim 1, wherein said power level detector includes a capacitor for coupling said output signal from said converter to detect said power level thereof irrespective of a DC level of said input signal.

6. The burst mode optical receiver as set forth in claim 1, wherein said power level detector is configured to determine whether an input signal is present based on the power level of said output signal from said converter.

7. The burst mode optical receiver as set forth in claim 6, wherein said power level detector determines that there is no input data if the power level of the output signal from said converter is lower than said predetermined value.

8. The burst mode optical receiver as set forth in claim 1, wherein said automatic gain controller selectively controls the gain of said converter based on a comparison between a voltage level of said output signal from said converter and a predetermined value.

9. The burst mode optical receiver as set forth in claim 8, wherein said automatic gain controller adjust the gain of said converter when the voltage level of said output signal is higher than said predetermined value.

10. The burst mode optical receiver as set forth in claim 8, wherein said automatic gain controller amplifies the input signal when the voltage level of said output signal is less than said predetermined value.

11. The burst mode optical receiver as set forth in claim 1, wherein said power level detector is configured to generate a LOS signal indicative of absence of said input signal when said detected power level is lower than said predetermined reference value.

12. The burst mode optical receiver as set forth in claim 11, further comprising a third pulse generator for generating a pulse signal as said LOS signal.

* * * * *